United States Patent
Fan et al.

(10) Patent No.: US 11,625,078 B2
(45) Date of Patent: Apr. 11, 2023

(54) CONDUCTIVE MODULE AND DISPLAY DEVICE

(71) Applicants: Interface Technology (ChengDu) Co., Ltd., Chengdu (CN); INTERFACE OPTOELECTRONICS (SHENZHEN) CO., LTD., Shenzhen (CN); INTERFACE OPTOELECTRONICS (WUXI) CO., LTD., Wuxi (CN); GENERAL INTERFACE SOLUTION LIMITED, Zhunan (TW)

(72) Inventors: Chia-Ming Fan, Chengdu (CN); Po-Lun Chen, Chengdu (CN); Chun-Ta Chen, Chengdu (CN); Po-Ching Lin, Chengdu (CN); Ya-Chu Hsu, Chengdu (CN); Chin-I Tu, Zhunan (TW); Kuo-Fung Huang, Zhunan (TW)

(73) Assignees: Interface Technology (ChengDu) Co, Ltd., Chengdu (CN); INTERFACE OPTOELECTRONICS (SHENZHEN) CO, LTD., Shenzhen (CN); INTERFACE OPTOELECTRONICS (WUXI) CO, LTD., Wuxi (CN); GENERAL INTERFACE SOLUTION LIMITED, Zhunan (TW)

(*) Notice: Subject to any disclaimer, the term of this patent is extended or adjusted under 35 U.S.C. 154(b) by 0 days.

(21) Appl. No.: 17/538,093

(22) Filed: Nov. 30, 2021

(65) Prior Publication Data

US 2023/0083312 A1    Mar. 16, 2023

(30) Foreign Application Priority Data

Sep. 14, 2021 (CN) .......................... 202111075476.8

(51) Int. Cl.
*G02F 1/1362* (2006.01)
*G06F 1/18* (2006.01)
(Continued)

(52) U.S. Cl.
CPC ........ *G06F 1/189* (2013.01); *G02F 1/136286* (2013.01); *G06F 3/0412* (2013.01);
(Continued)

(58) Field of Classification Search
CPC .................................................... G02F 1/1362
See application file for complete search history.

(56) References Cited

U.S. PATENT DOCUMENTS

2006/0192223 A1* 8/2006 Lee .......................... H01L 33/38
257/99
2014/0070235 A1* 3/2014 Andrews ................. H01L 33/48
438/28
(Continued)

*Primary Examiner* — Sang V Nguyen
(74) *Attorney, Agent, or Firm* — ScienBiziP, P.C.

(57) ABSTRACT

A conductive module includes spaced conductive layers and connecting lines. Adjacent conductive layers are electrically connected by one connecting line. Each connecting line includes a contact portion and an extending portion, the contact portion is electrically connected to one conductive layer and the extending portion. The extending portion is very stretchable in effective length to render the conductive module stretchable and deformable. A projection of the contact portion on a plane where the extending portion extends is a square, a width of the extending portion is equal to a side length of the contact portion.

15 Claims, 6 Drawing Sheets

(51) Int. Cl.
  *G06F 3/041* (2006.01)
  *H01L 25/075* (2006.01)
  *H01L 33/62* (2010.01)

(52) U.S. Cl.
  CPC ...... *G06F 3/04164* (2019.05); *H01L 25/0753* (2013.01); *H01L 33/62* (2013.01)

(56) References Cited

U.S. PATENT DOCUMENTS

| | | | |
|---|---|---|---|
| 2015/0263256 A1* | 9/2015 | Hsieh | H01L 33/62 257/91 |
| 2016/0372509 A1* | 12/2016 | Sekikawa | H01L 27/14612 |
| 2019/0146254 A1* | 5/2019 | Huang | G02F 1/1368 349/12 |

* cited by examiner

CONDUCTIVE MODULE AND DISPLAY DEVICE

REFERENCE TO RELATED APPLICATIONS

The present application is based on, and claims priority from, China application number 202111075476.8, filed Sep. 14, 2021, the disclosure of which is hereby incorporated by reference herein in its entirety.

FIELD

The subject matter herein generally relates to flexible conductive module technology, and particularly relates to a conductive module and a display device, including the conductive module.

BACKGROUND

A conventional electronic device (such as a wearable display, or a curved touch device) may deform when working. The electronic device can include a conductive structure which is flexible to achieve the deformation. The stretchable conductive structure may electrically connected to a non-stretchable conductive structure. A junction between the stretchable conductive structure and the non-stretchable conductive structure is susceptible to breaking, causing non- or mal-function.

BRIEF DESCRIPTION OF THE DRAWINGS

Implementations of the present disclosure will now be described, by way of embodiment, with reference to the attached figures.

DETAILED DESCRIPTION

It will be appreciated that for simplicity and clarity of illustration, where appropriate, reference numerals have been repeated among different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

Figure 1:
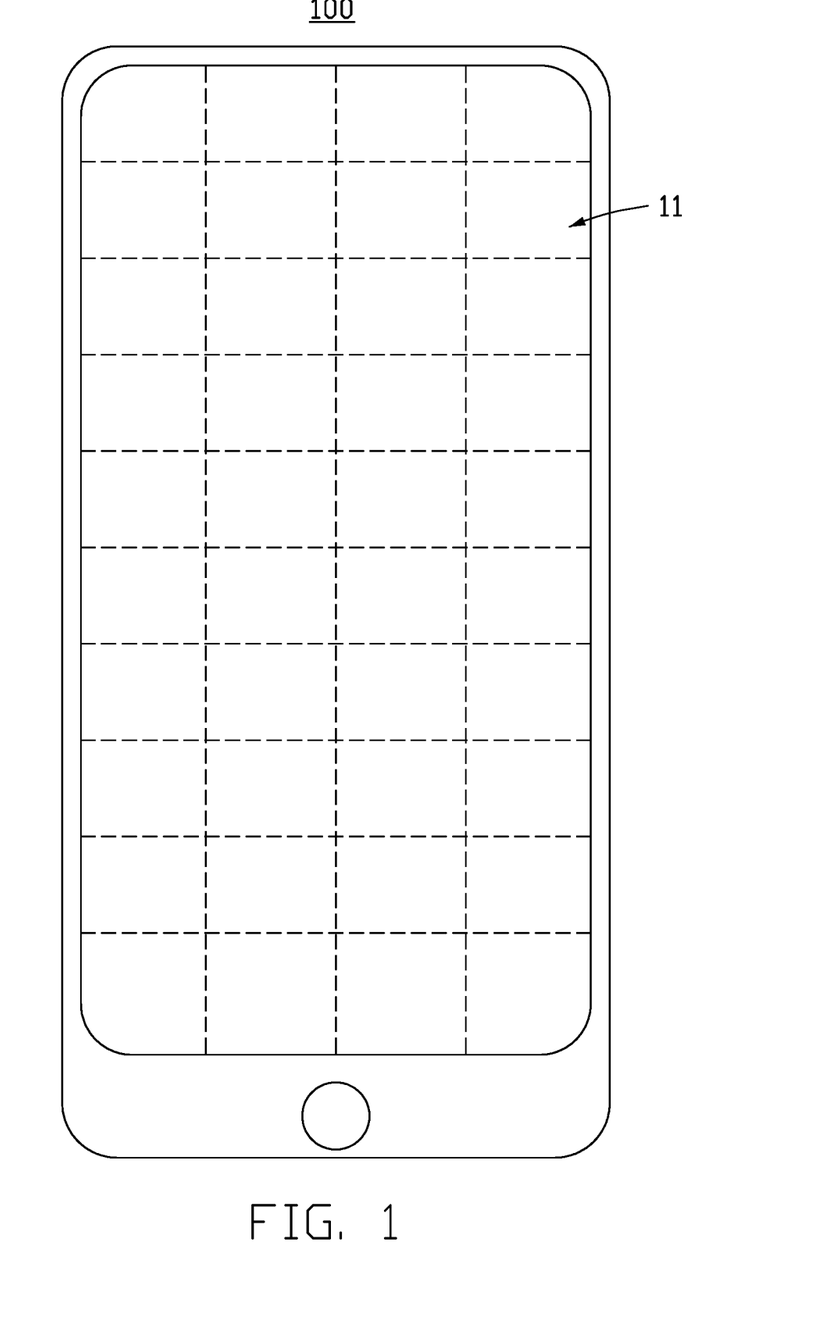
FIG. 1 is a planar view of a display device in an embodiment of the present disclosure.

As shown in FIG. 1, a display device 100 of the present embodiment is used to display images. The display device 100 may be a light emitting diode display, an organic light emitting display, or a liquid crystal display, etc. In this exemplary embodiment, the display device 100 is a light emitting diode display. The display device 100 includes a plurality of pixels 11 arranged in an array including a plurality of rows and a plurality of columns. Each pixel 11 is provided with a light emitting diode (LED). The LEDs in the pixels 11 are driven to emit light to enable the display device 100 to display the images.

Figure 2:
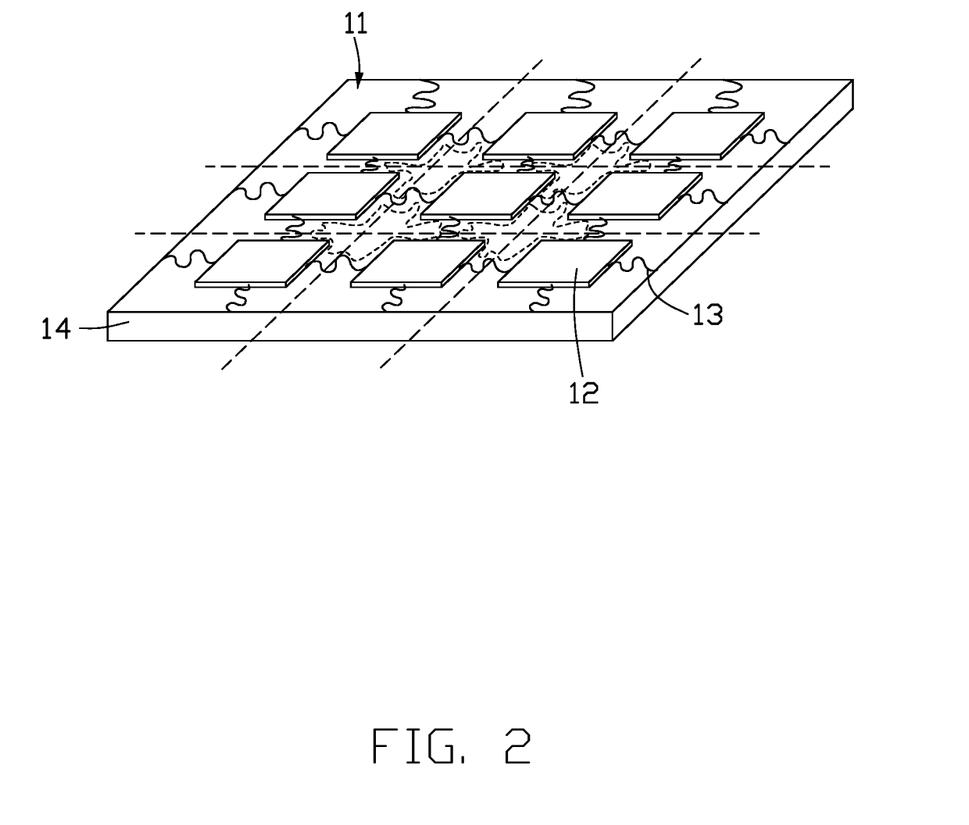
FIG. 2 is another planar view of the display device in the embodiment of the present disclosure.

As shown in FIG. 2, the display device 100 includes a plurality of conductive layers 12. Each pixel 11 is provided with a conductive layer 12. That is, the number of conductive layers 12 is equal to the number of pixels 11. The conductive layers 12 are also arranged in an array including a plurality of rows and a plurality of columns. In this embodiment, each conductive layer 12 is an electrode of one of the LEDs a pixel 11. In other embodiments, each conductive layer 12 may be a pixel electrode when the display device 100 is a liquid crystal display. In other embodiments, the conductive layers 12 may be located outside the pixels 11. For example, each conductive layer 12 may be a terminal of a chip and be in a non-display area of the display device 100.

The display device 100 also includes a plurality of connecting lines 13. Each connecting line 13 is configured to electrically connect two adjacent conductive layers 12. There is one connection line 13 between adjacent conductive layers 12 in each row, and there is one connection line 13 between adjacent conductive layers 12 in each column. In this exemplary embodiment, connection lines 13 connecting conductive layers 12 in a same row are used to transmit gate driving signals, and connection lines 13 connecting conductive layers 12 in a same column are used to transmit data signals. The display device 100 is used to display the images according to the gate driving signals and the data signals.

The display device 100 also includes a substrate 14, wherein the conductive layers 12 and the connection lines 13 are on a same surface of the substrate 14.

Figure 3:
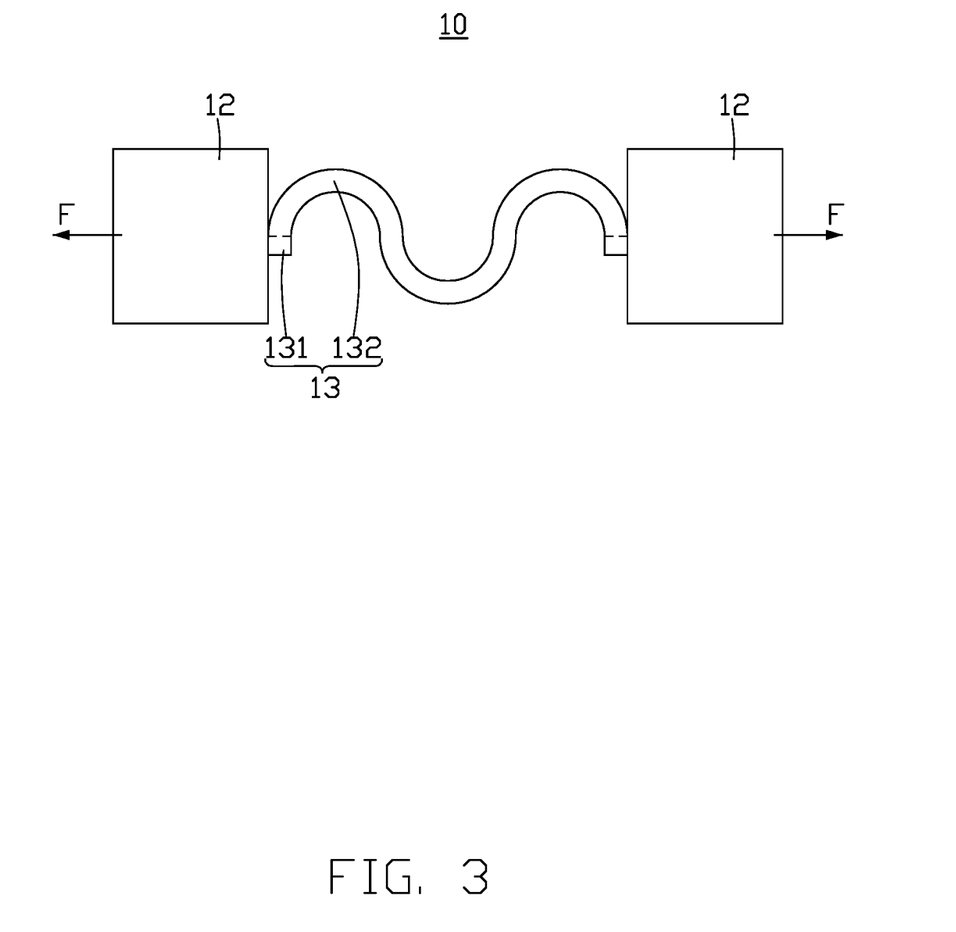
FIG. 3 is a planar view of a conductive module and a connecting line in FIG. 2.

As shown in FIG. 2 and FIG. 3, each connecting line 13 includes a contact portion 131 and an extending portion 132. The contact portion 131 is electrically connected to one of the conductive layers 12 and the extending portion 132 so that the conductive layer 12 and the extending portion 132 are electrically connected. In this embodiment, each connecting line 13 includes two contact portions 131 and one extending portion 132. The extending portion 132 is electrically connected between the two contact portions 131. The two contact portions 131 are used to electrically connect different conductive layers 12.

In the display device 100 of the present embodiment, each conductive layer 12 itself is made of rigid and inflexible material. In the display device 100 of the present embodiment, each connecting line 13 is also made of rigid material. The extending portion 132 is flexible and is made in the shape of a curve (such as wavy or in a sine wave shape). That is, the extending portion 132 is not straight in a nature state. When the display device 100 is pulled (that is, subjected to a tensile force), neither the conductive layers 12 nor the contact portions 131 deform to a significant extent, while the extending portions 132 do deform. The extending portions 132 being flexible allow the whole display device 100 to stretch and deform even though the conductive layers 12 and the contact portions 131 are not themselves flexible. Therefore, an area between adjacent conductive layers 12 in the display device 100 (that is, an area crossed by each connecting line 13) is defined as a stretchable area of the display device 100, and the area where each conductive layer 12 is located in the display device 100 is defined as a non-stretchable area of the display device 100.

The conductive layers 12 and the contact portions 131 are not stretchable, so reducing a risk of fracture of the conductive layers 12 and the contact portions 131. In other embodiments, the conductive layers 12 and the contact portions 131 may in fact stretch to a certain extent, which increases overall deformation capacity of the whole display device 100.

In this exemplary embodiment, the conductive layers 12, the extending portions 132, and the contact portions 131 are formed by a patterning process (such as etching, laser cutting, etc.). A same material can be formed in a same patterning process. For example, in this embodiment, if material of the extending portions 132 and the contact portions 131 are the same, the extending portions 132 and the contact portions 131 may be formed in a same patterning process. In other embodiments, the conductive layers 12 are may made of stretchable material, if material of the conductive layers 12, the extending portions 132, and the contact portions 131 are the same, the conductive layers 12, the extending portions 132, and the contact portions 131 can be formed in a same patterning process, which simplifies manufacturing process of display device.

In this embodiment, the conductive layers 12 have a same structure, the extending portions 132 have a same structure, and the contact portions 131 have a same structure. Only one conductive layer 12, one extending portion 132, and one contact portion 131 are shown in FIG. 3, being examples only to illustrate structures and electrical connection relationships of the conductive layers 12, the extending portions 132, and the contact portions 131.

In this embodiment, the connecting lines 13 are made of rigid conductive materials such as gold, copper, aluminum, molybdenum, and titanium or other metal. In other embodiment, the connecting lines 13 are made of conductive paste such as silver paste, carbon paste, or copper paste. In other embodiments, the connecting lines 13 may be made of conductive material with deformation ability. Further, the connecting lines 13 are made in form of wave, which itself improves the deformability of the connecting lines 13 and the display device 100.

In some embodiment, the substrate is made of materials with deformability so that the whole display device 100 is stretchable.

In this exemplary embodiment, each extending portion 132 is curved as a natural state, and each extending portion 132 will become straighter and increase in effective length when pulled or stretched by a tensile force.

When the display device 100 is subjected to a tensile force (tensile force F), neither of the conductive layers 12 and the contact portions 131 deform, while the extending portions 132 are stretched in deformation, so that the whole display device 100 can deform. If the conductive layer 12 was directly electrically connected to the extending portion 132, the tensile force F would cause stress at each junction between the conductive layers 12 and the connecting lines 13 when the display device 100 was subjected to the tensile force F, increasing the fracture risk of the connecting lines 13. In this embodiment, the contact portions 131 serve to reduce the fracture risk of the connecting lines 13 when pulled.

In one exemplary embodiment, each extending portion 132 has a uniform width (width d). A projection of each contact portion 131 on a plane where the extending portions 132 extend is a square. That is, the extending portions 132 is on the plane, and a pattern of the projection is a square. Therefore, each contact portion 131 includes four sides. One of the four sides is utilized as the electrical connection to one extending portion 132 and the other one of the four sides adjacent to the one of the four sides is electrically connected to one conductive layer 12. Since a side length L of the projection is equal to the width d of each extending portion 132, sizes of the contact portions 131 match sizes of the extending portions 132. Then, when the extending portions 132 are stretched, intensity of stress at the junctions of the contact portions 131 and the extending portions 132 is reduced so as to render the connecting lines 13 almost unbreakable. Therefore, the contact portions 131 improve connection strength between the conductive layers 12 and the connecting lines 13. In other embodiments, all extending portions 132 do not have a uniform width, the side length L of each contact portion 131 is equal to a width where the extending portions 132 connect the contact portions 131.

Figure 4:
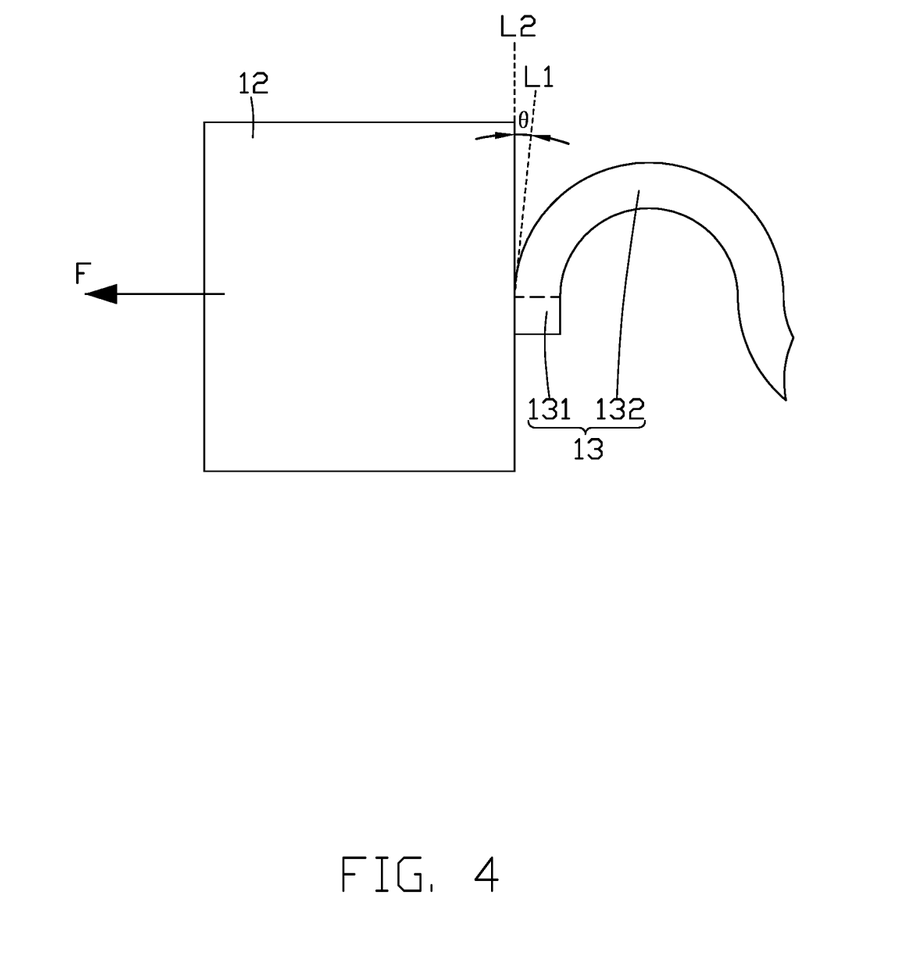
FIG. 4 is another planar view of the conductive module and the connecting line in FIG. 2.

As shown in FIG. 4, in this embodiment, since the extending portions 132 are wave-like in shape, each arc or curve has tangent lines, a tangent line at a connection location between each extending portion 132 and each contact portion 131 being defined as a tangent line L1. Each contact portion 131 is connected to the conductive layer 12 at an edge of the conductive layer 12, a straight line of such edge being defined as a contact line L2. In this embodiment, an included angle θ between the tangent line L1 and the contact line L2 is less than 30°. Therefore, each extending portion 132 and each contact portion 131 are smoothly connected, which is conducive to smoother absorption of stress when the connecting lines 13 are stretched.

Figure 5:
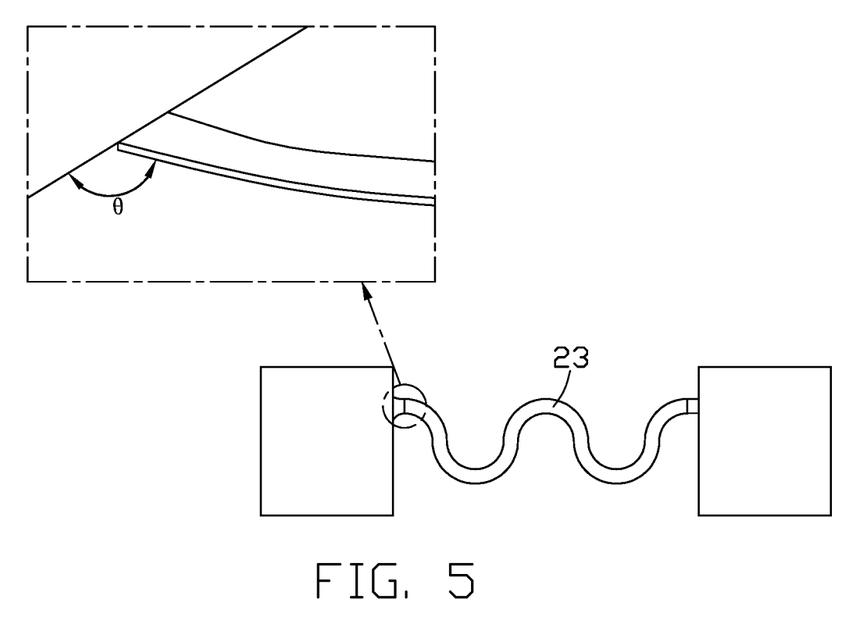
FIG. 5 is a planar view of a conductive module and a connecting line in a comparative embodiment.
Figure 6:
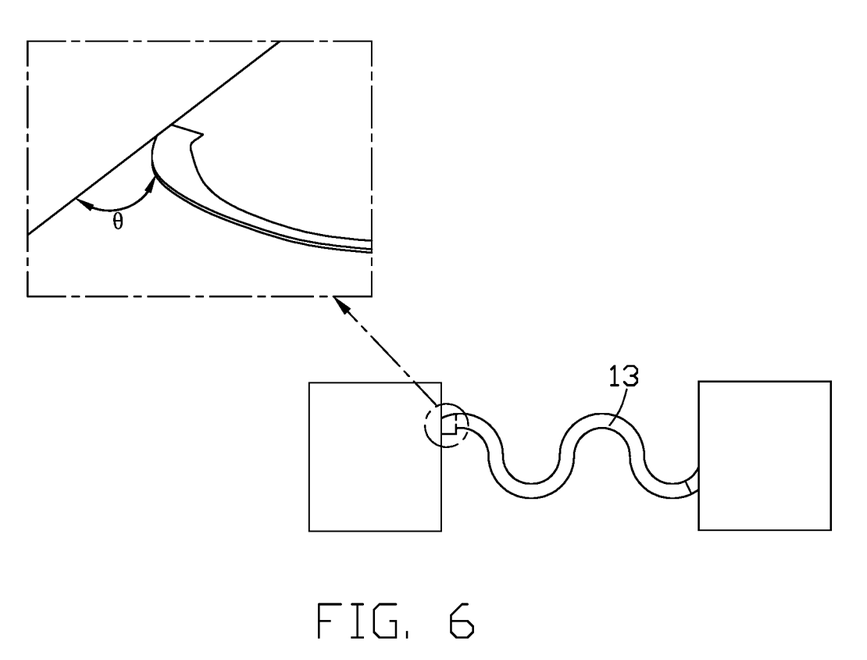
FIG. 6 is another planar view of the conductive module and the connecting line in FIG. 2.

As shown in FIG. 5, in a comparative embodiment, an included angle θ between a tangent line L1 and a contact line L2 is greater than 30°. As shown in FIG. 6, the included angle θ between the tangent line L1 and the contact line L2 in this embodiment is less than 30°. When tensile force F is applied, a stress measured on the connecting line 23 in FIG. 5 is 423.1 MPa, while a stress measured on the connecting line 13 in FIG. 6 is 337.1 MPa. When the included angle θ between the tangent L1 and the contact line L2 is reduced, the stress on the connecting line 13 is also significantly reduced. This embodiment promotes reduction of the impact of stress by making the included angle θ between the tangent line L1 and the contact line L2 less than 30°, which also improves the connection strength between the extending portions 132 and the contact portions 131 and the electrical connection between the extending portions 132 and the conductive layers 12.

Figure 7:
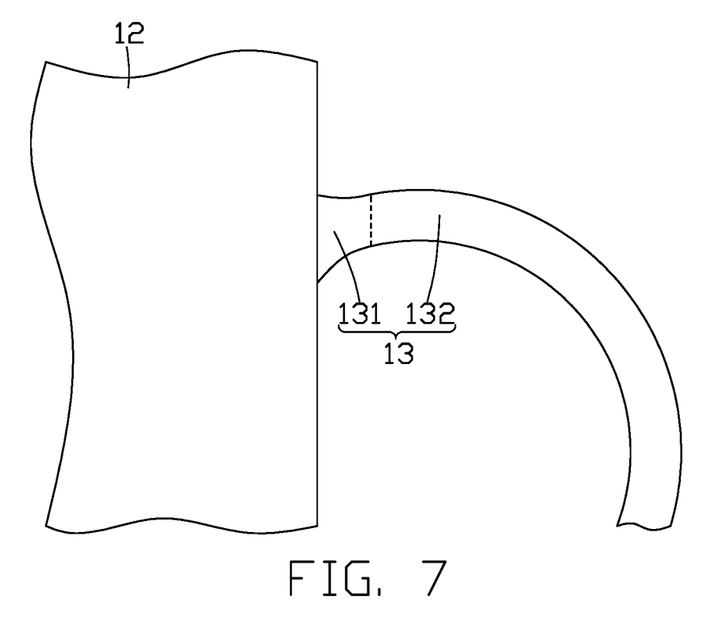
FIG. 7 is a planar view of a conductive module and a connecting line in a modified embodiment.

As shown in FIG. 7, in a modified embodiment, a projection of each contact portion 131 on a plane where the extending portions 132 extend is smooth in contour and not square. That is, at least two edges of each contact portion 131 are curved. In this way, the contact portions 131 and the extending portions 132 flow smoothly shape-wise into each other, reducing stress at the junction between each extending portion 132 and each contact portion 131.

Figure 8:
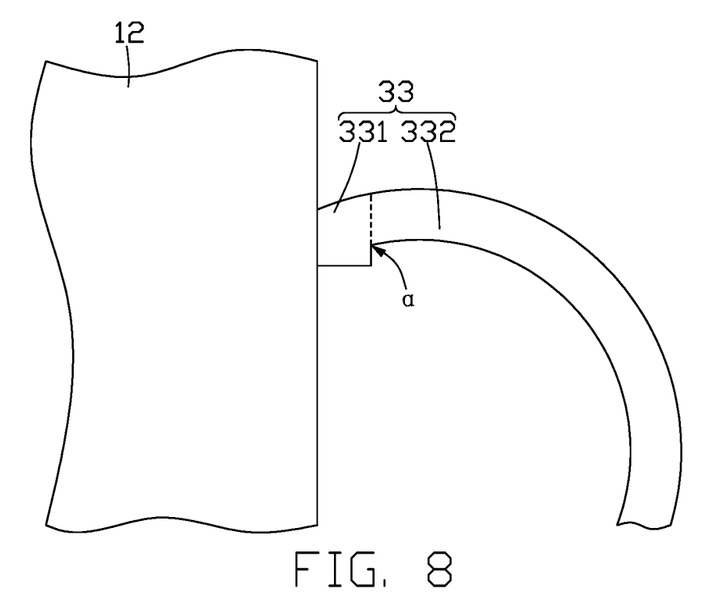
FIG. 8 is a planar view of a conductive module and a connecting line in another embodiment.

As shown in FIG. 8, in a comparative embodiment, the contact portions 331 and the extending portions 332 do not flow smoothly into each other shape-wise but form an angle α, which increases stress at the junction of each extending portion 332 and each contact portion 331. When tensile force F is applied, a stress on the connecting line 33 of the comparative embodiment is 474.7 MPa, while a stress on the connecting line 13 in FIG. 7 is 423.1 MPa. A smooth transition in shape reduces stress at the junction of each extending portion 132 and each contact portion 131, which again improves the connection strength between the extending portions 132 and the contact portions 131 and improves the quality of electrical connection between the connecting lines 13 and the conductive layers 12.

Structures shown in FIG. 3 can be applied as a conductive module for any device which must undergo deformation. For example, such device may include a touch panel. When the conductive module 10 is inside the touch panel, each conductive layer 12 may be a touch electrode, or a touch chip, etc. When the conductive module 10 is used in such touch panel, all beneficial effects of the display device 100 are realized.

It is to be understood, even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A conductive module, comprising:
a plurality of conductive layers spaced apart from each other; and
a plurality of connecting lines, each two adjacent conductive layers of the plurality of conductive layers being electrically connected to each other by one of the plurality of connecting lines;
wherein each of the plurality of connecting lines comprises a contact portion and an extending portion, the contact portion is electrically connected to one of the plurality of conductive layers and the extending portion, the extending portion is stretchable to enable the conductive module to be stretchable, a projection of the contact portion on a plane where the extending portion extends is a square, a width of the extending portion is equal to a side length of the contact portion, a tangent line is defined at a position where the extending portion connects to the contact portion, the contact portion connects to the conductive layer at an edge of the conductive layer, a straight line where the edge locates is defined as a contact line, and an included angle between the tangent line and the contact line is less than 30°.

2. The conductive module of claim 1, wherein the contact portion comprises four sides, one of the four sides is electrically connected to the extending portion and the other one of the four sides adjacent to the one of the four sides is electrically connected to one of the plurality of conductive layers.

3. The conductive module of claim 1, wherein the extending portion of each of the plurality of connecting lines is curved in a natural state.

4. The conductive module of claim 3, wherein the extending portion of each of the plurality of connecting lines is wavy in a natural state.

5. The conductive module of claim 3, wherein the extending portion of each of the plurality of connecting lines is in a sine wave shape in a natural state.

6. A display device, comprising:
a conductive module comprising:
a plurality of conductive layers spaced apart from each other; and
a plurality of connecting lines, each two adjacent conductive layers of the plurality of conductive layers being electrically connected by one of the plurality of connecting lines;
wherein each of the plurality of connecting lines comprises a contact portion and an extending portion, the contact portion is electrically connected to one of the plurality of conductive layers and the extending portion, the extending portion is stretchable to enable the conductive module stretchable, a projection of the contact portion on a plane where the extending portion extends is a square, a width of the extending portion is equal to a side length of the contact portion, a tangent line is defined at a position where the extending portion connects to the contact portion, the contact portion connects to the conductive layer at an edge of the conductive layer, a straight line where the edge locates is defined as a contact line, and an included angle between the tangent line and the contact line is less than 30°;
the conductive module is configured to receive driving signals to drive the display device to display images.

7. The display device of claim 6, wherein the contact portion comprises four sides, one of the four sides is electrically connected to the extending portion and the other one of the four sides adjacent to the one of the four sides is electrically connected to one of the plurality of conductive layers.

8. The display device of claim 6, wherein the extending portion of each of the plurality of connecting lines is curved in a natural state.

9. The display device of claim 8, wherein the extending portion of each of the plurality of connecting lines is wavy in a natural state.

10. The display device of claim 8, wherein the extending portion of each of the plurality of connecting lines is in a sine wave shape in a natural state.

11. The display device of claim 6, wherein an area between each two adjacent conductive layers of the plurality of conductive layers is defined as a non-stretchable area, and an area where each of the plurality of connecting lines locates is defined as a stretchable area.

12. The display device of claim 6, further comprise a plurality of pixels and a plurality of connecting lines, each of the plurality of conductive layers is in one of the plurality of pixels.

13. The display device of claim 12, wherein the display device is a liquid crystal display, and each of the plurality of conductive layers is a pixel electrode.

14. The display device of claim 12, wherein the display device is a light emitting diode display, the display device comprises a plurality of light emitting diodes, each of the plurality of light emitting diodes is in one of the plurality of pixels, and each of the plurality of conductive layers is one of the plurality of light emitting diodes.

15. The display device of claim 6, further comprises a touch panel, the plurality of conductive layers comprises a plurality of touch electrodes and/or a touch chip.

\* \* \* \* \*